United States Patent
Fu et al.

(10) Patent No.: US 10,439,123 B2
(45) Date of Patent: Oct. 8, 2019

(54) APPARATUS, SYSTEMS, AND METHODS FOR GENERATING THERMOPOWER

(71) Applicant: Massachusetts Institute of Technology, Cambridge, MA (US)

(72) Inventors: Liang Fu, Winchester, MA (US); Brian J. Skinner, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/012,560

(22) Filed: Jun. 19, 2018

(65) Prior Publication Data

US 2018/0366633 A1   Dec. 20, 2018

Related U.S. Application Data

(60) Provisional application No. 62/521,751, filed on Jun. 19, 2017, provisional application No. 62/626,891, filed on Feb. 6, 2018.

(51) Int. Cl.
  *H01L 35/32* (2006.01)
  *H01L 35/02* (2006.01)
  *H01L 35/14* (2006.01)

(52) U.S. Cl.
  CPC ............ *H01L 35/32* (2013.01); *H01L 35/02* (2013.01); *H01L 35/14* (2013.01)

(58) Field of Classification Search
  None
  See application file for complete search history.

(56) References Cited

U.S. PATENT DOCUMENTS

| | | |
|---|---|---|
| 5,006,505 A | 4/1991 | Skertic |
| 5,376,184 A | 12/1994 | Aspden |
| 5,563,368 A | 10/1996 | Yamaguchi |
| 8,053,947 B2 | 11/2011 | Kriisa |
| 2002/0069907 A1 | 6/2002 | Yamashita |
| 2007/0024154 A1 | 2/2007 | Kucherov et al. |

OTHER PUBLICATIONS

Cano et al., The Chiral anomaly factory: creating weyl fermions with a magnetic field, phys. rev. b. 95, 161306 (Year: 2017).*
International Search Report and Written Opinion in International Patent Application No. PCT/US2018/038274 dated Jan. 4, 2019, 13 pages.

(Continued)

*Primary Examiner* — Shannon M Gardner
(74) *Attorney, Agent, or Firm* — Smith Baluch LLP

(57) ABSTRACT

A thermoelectric device includes a thermoelectrode characterized by a band gap less than $k_B T$, where $k_B$ is the Boltzmann constant and T is a temperature of the thermoelectrode. The device also includes a magnetic field source, operably coupled to the thermoelectrode, to apply a magnetic field B on the thermoelectrode along a first direction. The device also includes a voltage source, operably coupled to the thermoelectrode, to apply an electric field E on the thermoelectrode along a second direction substantially perpendicular to the first direction so as to generate a heat flow along the second direction.

18 Claims, 6 Drawing Sheets

(56) References Cited

OTHER PUBLICATIONS

Arora et al., "Thermoelectric power in high magnetic fields." Journal of Magnetism and Magnetic Materials 11.1-3 (1979): 80-83.
Bergman, "Theory of dissipationless Nernst effects." Physical review letters 104.6 (2010): 066601. 4 pages.
Bhattacharya et al., "Spatially inhomogeneous electron state deep in the extreme quantum limit of strontium titanate." Nature communications 7 (2016): 12974. 9 pages.
Chen, "Anomalously small resistivity and thermopower of strongly compensated semiconductors and topological insulators." Physical Review B 87.16 (2013): 165119. 7 pages.
Dingle, Scattering of electrons and holes by charged donors and acceptors in semiconductors. The London, Edinburgh, and Dublin Philosophical Magazine and Journal of Science 46.379 (1955): 831-840.
Dixon et al., "Influence of band inversion upon the electrical properties of $Pb_xSn_{1-x}Se$ in the low carrier concentration range." Solid State Communications 7.24 (1969): 1777-1779.
Dresselhaus et al., "New directions for low-dimensional thermoelectric materials." Advanced materials 19.8 (2007): 1043-1053.
Dziawa et al., "Topological crystalline insulator states in $Pb_{1-x}Sn_xSe$." Nature materials 11.12 (2012): 1023. 11 pages.
Gurevich et al., "Nature of the thermopower in bipolar semiconductors." Physical Review B 51.11 (1995): 6999. 6 pages.
Herring, "Transport properties of a many?valley semiconductor." Bell System Technical Journal 34.2 (1955): 237-290.
Jay-Gerin, "Thermoelectric power of semiconductors in the extreme quantum limit. II. The "phonon-drag" contribution." Physical Review B 12.4 (1975): 1418. 14 pages.
Jay-Gerin, "Thermoelectric power of semiconductors in the extreme quantum limit—I: The 'electron diffusion' contribution." Journal of physics and chemistry of solids 35.1 (1974): 81-87.
Jeon et al., "Landau quantization and quasiparticle interference in the three-dimensional Dirac semimetal $Cd_3As_2$." Nature materials 13.9 (2014): 851. 6 pages.
Kozuka et al., "Vanishing Hall coefficient in the extreme quantum limit in photocarrier-doped $SrTiO_3$." Physical review letters 101.9 (2008): 096601. 4 pages.
Li et al., "Chiral magnetic effect in $ZrTe_5$." Nature Physics 12.6 (2016): 550. 6 pages.
Liang et al., "Evidence for massive bulk Dirac fermions in $Pb_{1-x}Sn_xSe$ from Nernst and thermopower experiments." Nature communications 4 (2013): 2696. 9 pages.
Liu et al., "Zeeman splitting and dynamical mass generation in Dirac semimetal $ZrTe_5$." Nature communications 7 (2016): 12516. 9 pages.
Mahan, "Figure of merit for thermoelectrics." Journal of applied physics 65.4 (1989): 1578-1583.
Obraztsov, "The thermal emf of semiconductors in a quantizing magnetic field(Thermoelectromotive force of semiconductors in strong magnetic field where effect of current carrier scattering is negligible)." Soviet Physics-Solid State 7 (1965): 455-461.
Pepper, "Metal-insulator transitions induced by a magnetic field." Journal of Non-Crystalline Solids 32.1-3 (1979): 161-185.
Rosenbaum et al., "Magnetic-field-induced localization transition in HgCdTe." Physical review letters 54.3 (1985): 241. 4 pages.
Shakouri, "Recent developments in semiconductor thermoelectric physics and materials." Annual review of materials research 41 (2011): 399-431.
Shayegan et al., "Magnetic-field-induced localization in narrow-gap semiconductors $Hg_{1-x}Cd_xTe$ and InSb." Physical Review B 38.8 (1988): 5585. 18 pages.
Shulumba et al., "Intrinsic localized mode and low thermal conductivity of PbSe." Physical Review B 95.1 (2017): 014302. 9 pages.
Skinner, "Coulomb disorder in three-dimensional Dirac systems." Physical Review B 90.6 (2014): 060202. 5 pages.
Tsendin, "Theory of Thermal EMF in a Quantizing Magnetic Field in Kane Model." Soviet Physics Solid State, USSR 8.2 (1966): 306. 4 pages.
Wang et al., "Chiral anomaly and ultrahigh mobility in crystalline $HfTe_5$." Physical Review B 93.16 (2016): 165127. 7 pages.

\* cited by examiner

US 10,439,123 B2

APPARATUS, SYSTEMS, AND METHODS FOR GENERATING THERMOPOWER

CROSS-REFERENCE TO RELATED APPLICATIONS

This application claims the priority benefit under 35 U.S.C. § 119(e) of U.S. Application No. 62/521,751, filed Jun. 19, 2017, entitled "REALIZATION OF LARGE THERMOPOWER USING SEMIMETALS AND NARROW-GAP SEMICONDUCTORS IN A MAGNETIC FIELD," and U.S. Application No. 62/626,891, filed Feb. 6, 2018, entitled "REALIZATION OF LARGE THERMOPOWER USING SEMIMETALS AND NARROW-GAP SEMICONDUCTORS IN A MAGNETIC FIELD," each of which is hereby incorporated herein by reference in its entirety.

GOVERNMENT SUPPORT

This invention was made with Government support under Grant Nos. DE-SC0001088, DE-SC0001299, and DE-SC0010526 awarded by the Department of Energy. The Government has certain rights in the invention.

BACKGROUND

The thermoelectric effect is the generation of an electrical voltage from a temperature gradient in a solid material due to the diffusion of free charge carriers from hot to cold. More specifically, when a temperature gradient is applied across a solid material with free electronic carriers, a voltage gradient arises as carriers migrate from the hot side to the cold side. The strength of this thermoelectric effect is characterized by the Seebeck coefficient S, defined as the ratio between the voltage difference $\Delta V$ and the temperature difference $\Delta T$. The absolute value of S is referred to as the thermopower. Finding materials with large thermopower can be vital for the development of thermoelectric generators and thermoelectric coolers, devices which can transform waste heat into useful electric power, or electric current into cooling power.

SUMMARY

Embodiments of the present invention include apparatus, systems, and methods for thermopower generation. In one example, a thermoelectric device includes a thermoelectrode characterized by a band gap less than $k_B T$, where $k_B$ is the Boltzmann constant and T is a temperature of the thermoelectrode. The device also includes a magnetic field source, operably coupled to the thermoelectrode, to apply a magnetic field B on the thermoelectrode along a first direction. The device also includes a voltage source, operably coupled to the thermoelectrode, to apply an electric field E on the thermoelectrode along a second direction substantially perpendicular to the first direction so as to generate a heat flow along the second direction.

In another example, a thermoelectric device includes a thermoelectrode characterized by a band gap less than $k_B T$, where $k_B$ is the Boltzmann constant and T is a temperature of the thermoelectrode. The device also includes a magnetic field source, operably coupled to the thermoelectrode, to apply a magnetic field B on the thermoelectrode along a first direction. The device also includes a heat source, operably coupled to the thermoelectrode, to apply a heat flow on the thermoelectrode along a second direction substantially perpendicular to the first direction so as to generate an electric field along the second direction of the heat flow.

In yet another example, a method of generating a heat flow includes applying a magnetic field B on a thermoelectrode along a first direction such that $\hbar\, v/l_B$ is larger than $E_F$, where $\hbar$ is the Planck constant, v is a Dirac velocity of charge carriers in the thermoelectrode, $E_F$ is the Fermi energy of the thermoelectrode, $l_B = \sqrt{\hbar/eB}$, and e is unit electron charge. The thermoelectrode is characterized by a band gap less than $k_B T$, where $k_B$ is the Boltzmann constant and T is a temperature of the thermoelectrode. The method also includes applying an electric field E on the thermoelectrode along a second direction substantially perpendicular to the first direction so as to generate the heat flow along the second direction.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Thermoelectric Devices

Figure 1:
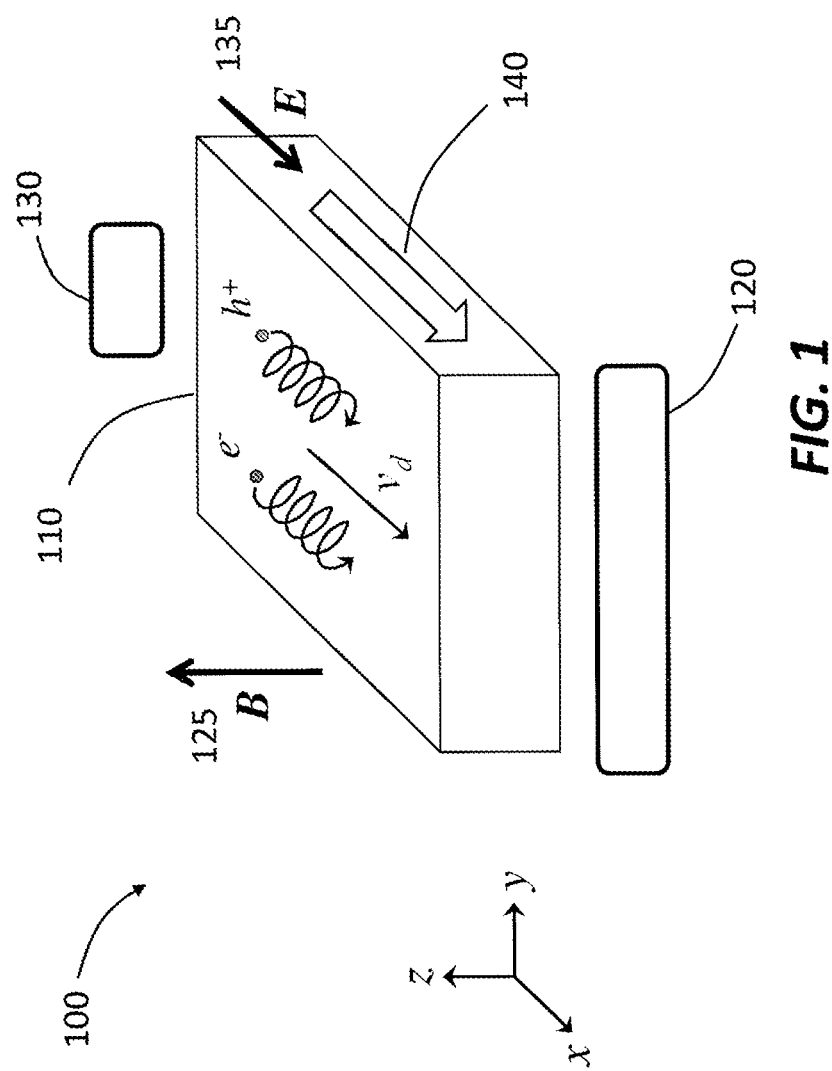
FIG. 1 shows a schematic of a thermoelectric device to generate a heat flow

Without being bound by any particular theory or mode of operation, the effectiveness of a thermoelectric material for power applications can be quantified by a thermoelectric figure of merit:

$$ZT = S^2 \sigma T / K \qquad (1)$$

where $\sigma$ is the electrical conductivity, T is the temperature, and $\kappa$ is the thermal conductivity. A large thermoelectric figure of merit may be achieved in either an insulator (e.g., an intrinsic or lightly-doped semiconductor) or a metal (e.g., a heavily-doped semiconductor).

In an insulator, the thermopower can be on the order of $E_0/(eT)$, where e is the electron charge and $E_0$ is the difference in energy between the chemical potential and the nearest band mobility edge. However, obtaining such a large thermopower usually comes at the expense of an exponentially small, thermally-activated conductivity, $\sigma \sim \exp(-E_0/k_B T)$, where $k_B$ is the Boltzmann constant. Since the thermal conductivity in general retains a power-law dependence on temperature due to phonons, the figure of merit ZT for insulators is typically optimized when $E_0$ and $k_B T$ are of the same order of magnitude. This yields a value of ZT that can be on the order of unity.

On the other hand, metals have a robust conductivity, but the Seebeck coefficient α is usually very small. In particular, in the best-case scenario where the thermal conductivity due to phonons is much smaller than that of electrons, the Wiedemann-Franz law dictates that the quantity $\sigma T/\kappa$ is a constant on the order of $(e/k_B)^2$. The Seebeck coefficient, however, is relatively small in metals, usually on the order of $k^2_B T/(eE_F)$, where $E_F \gg k_B T$ is the metal's Fermi energy. If the temperature is increased to the point that $k_B T > E_F$, the Seebeck coefficient typically saturates at a constant on the order of $k_B/e$. The maximum value of the figure of merit in metals can be obtained when $k_B T$ is of the same order as $E_F$. Similar to insulators, metals achieve an apparent maximum value of ZT that is of order unity.

The above limitations can be addressed using doped nodal semimetals in a strong magnetic field to construct a thermoelectrode for which the figure of merit ZT can be much greater than 1. This approach takes advantage of three techniques. First, a sufficiently high magnetic field is applied over the thermoelectrode to produce a large enhancement of the electronic density of states and a reduction in the Fermi energy $E_F$. For example, the enhancement can be about 10% or greater (e.g., about 10%, about 20%, about 30%, about 50%, about 100%, about 200%, about 300%, about 500%, about 1000%, or greater, including any values and sub ranges in between). Second, the large magnetic field is also employed to produce the condition $\sigma_{xy} \gg \sigma_{xx}$, where $\sigma_{xy}$ is the Hall conductivity and $\sigma_{xx}$ is the longitudinal conductivity, which assures that the transverse E×B drift of carriers in the thermoelectrode is dominant in the charge transport. The dominance of E×B drift allows both electrons and holes to contribute additively to the thermopower. In contrast, without the magnetic field, electrons and holes contribute subtractively to the thermopower, thereby limiting the thermopower generation. Third, the thermoelectrode includes materials having a small band gap and electron-hole symmetry in their band structure. In this case, the Fermi level remains close to the band edge in the limit of large magnetic field, and this allows the number of thermally-excited electrons and holes to grow with magnetic field even when their difference remains fixed. These three techniques together allow the thermopower to grow without saturation as a function of magnetic field.

FIG. 1 shows a schematic of a thermoelectric device 100 for generating heat flows under a magnetic field. The device 100 includes a thermoelectrode 110 made of a small band gap material. For example, the material of the thermoelectrode 110 can be characterized by a band gap less than $k_B T$, where $k_B$ is the Boltzmann constant and T is the temperature of the thermoelectrode. The device 100 also includes a magnetic field source 120, operably coupled to the thermoelectrode 110, to apply a magnetic field 125 on the thermoelectrode 110 along a first direction (e.g., z direction as shown in FIG. 1). The device 100 further includes a voltage source 130, operably coupled to the thermoelectrode 110, to apply an electric field 135 on the thermoelectrode 110 along a second direction (e.g., x direction as shown in FIG. 1) substantially perpendicular to the first direction so as to generate a heat flow 140 along the second direction.

As shown in FIG. 1, electrons (labeled e⁻) and holes (labeled h⁺) drift (under the E×B force) in the same direction under the influence of crossed electric and magnetic fields. Both signs of carrier contribute additively to the heat current in the x direction and subtractively to the electric current in the x direction, which can lead to a large Peltier heat $\Pi_{xx}$ and therefore to a large thermopower $S_{xx}$.

Various materials can be used in the thermoelectrode 110. In one example, the thermoelectrode 110 include materials for which low-energy electronic excitations have an energy that depends linearly on momentum. In some examples, charge carriers in the thermoelectrode are characterized by a linear dispersion, which can provide a density of states that reaches zero at only one point, and which varies with energy as $E^2$.

In some examples, the thermoelectrode 110 includes a semimetal, such as a Weyl semimetal, which is a solid state crystal whose low energy excitations are Weyl fermions that carry electrical charge even at room temperatures. A Weyl semimetal can be used to enable realization of Weyl fermions in electronic systems. In some examples, the thermoelectrode 110 includes a three-dimensional (3D) Dirac metal.

In some examples, the thermoelectrode 110 can include doped semiconductors. The doping concentration can be, for example, about $10^{15}$ cm⁻³ to about $10^{19}$ cm⁻³ (e.g., about $10^{15}$ cm⁻³, about $10^{16}$ cm⁻³, about $10^{17}$ cm⁻³, about $10^{18}$ cm⁻³, or about $10^{19}$ cm⁻³, including any values and sub ranges in between).

In some examples, the thermoelectrode has a first resistivity $\rho_{xx}$ longitudinal to the first direction and a transverse Hall resistivity $\rho_{xy}$ transverse to the first direction. And the second resistivity is greater than the first resistivity.

The magnetic field source 120 can employ various technologies to generate the magnetic field 125. In one example, the magnetic field source 120 includes a solenoid to generate the magnetic field 125. In another example, the magnetic field source 120 can include one or more permanent magnets. In some example, the magnets can include superconducting magnets.

The magnetic field source 120 can be configured to generate the magnetic field 125 such that $\hbar v/l_B$ is greater than $E_F$, where $\hbar$ is the Planck constant, v is a Dirac velocity of charge carriers in the thermoelectrode 110, $E_F$ is the Fermi energy of the thermoelectrode 110, $l_B = \sqrt{\hbar/eB}$, and e is unit electron charge, i.e. the ratio of $\hbar v/l_B$ to $E_F$ is greater than 1 (e.g., about 1.5, about 2, about 3, about 5, about 10, about 20, or greater, including any values and sub ranges in between).

In some examples, the magnetic field 125 can be substantially equal to or greater than 1 T (e.g., about 1 T, about 2 T, about 3 T, about 5 T, about 10 T, about 20 T, about 30 T, about 50 T, about 100 T, or greater, including any values and sub ranges in between). Magnetic field 125 less than 1 T can also be used.

Figure 2:
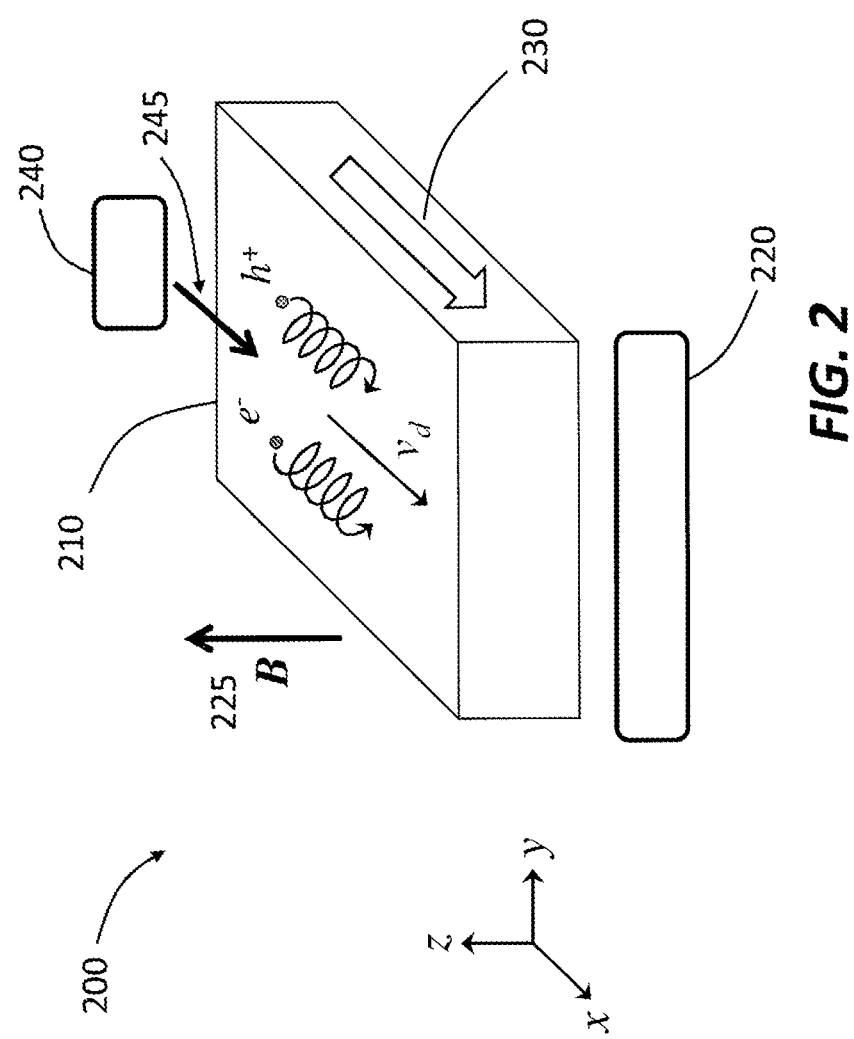
FIG. 2 shows a schematic of a thermoelectric device to generate an electric field.

FIG. 2 shows a schematic of a thermoelectric device 200 for generating an electric field. The device 200 includes a thermoelectrode 210 characterized by a band gap less than $k_B T$, where $k_B$ is the Boltzmann constant and T is a temperature of the thermoelectrode. The thermoelectrode 210 can be substantially similar to the thermoelectrode 110 in the device 100 and described above. The device 200 also includes a magnetic field source 220, operably coupled to the thermoelectrode 210, to apply a magnetic field 225 on the thermoelectrode 210 along a first direction. An optional heat source 240 is operably coupled to the thermoelectrode 210 to apply a heat flow 245 on the thermoelectrode 210 along a second direction substantially perpendicular to the first direction so as to generate an electric field 230 along the second direction of the heat flow.

FIGS. 1 and 2 illustrate the reversible operation of thermoelectrodes 110 and 210. On the one hand, an electric field (e.g., 125) can be applied on the thermoelectrode to generate a heat flow for heating or cooling applications. On the other hand, a heat flow (e.g., 245) can be applied on the thermoelectrode to generate an electric field and accordingly electricity, i.e. the device is employed as a power generator. The devices 100 and 200 can therefore be used in various applications.

In one example, the device 100 can be used in particle accelerators, such as Large Hadron Collider (LHC), which strong magnetic field (e.g., about 8 T) is used. This magnetic field is typically generated by superconductors that operate at low temperatures. Therefore, the device 100 can be used for cooling these superconductors under the strong magnetic field.

In another example, the device 200 can be used in any application where waste heat is generated. For example, the device 200 may be coupled to the exhaust manifold of an engine, such as an automobile engine. The heat source 240 of the device 200 can include the hot exhaust gas for electricity generation. This technology can be used in, for example, hybrid automobiles.

In yet another example, the heat source 240 in the device 200 can include an exhaust coolant from an industrial application or an internal combustion engine. Many industrial processes generate a great amount of heat that is taken away by coolants, such as water or oil. These heated coolants can be employed as the heat source 240 to apply the heat flow 245 on the thermoelectrode 210 to generate electricity.

Figure 3:
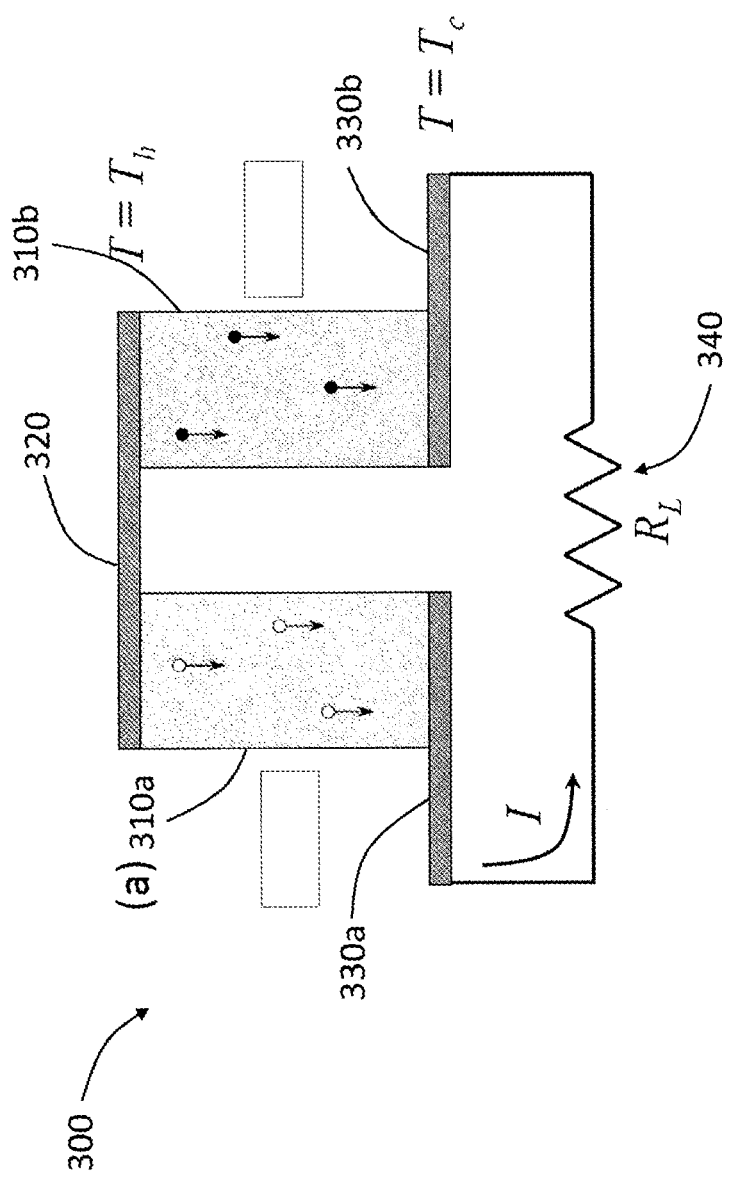
FIG. 3 shows a schematic of a thermocouple including thermoelectric devices shown in FIGS. 1 and 2.

FIG. 3 shows a schematic of a thermocouple 300 using thermoelectrodes that are shown in FIGS. 1 and 2. The thermocouple 300 includes a first thermoelectrode 310a and a second thermoelectrode 310b. A first electrode 320 is employed to electrically couple the first thermoelectrode 310a with the second thermoelectrode 310b on one end of the two thermoelectrodes. The other ends of the thermoelectrodes are electrically coupled together via two electrodes 330a and 330b and a resistor 340.

The material of the first thermoelectrode 310a can be different from the material of the thermoelectrode 310b so as to form a junction. For example, the two thermoelectrodes 310a and 310b can be made from distinct alloys $Pb_{1-x1}Sn_{x1}Se$ and $Pb_{1-x2}Sn_{x2}Se$, where the alloy composition x1<0.35 and x2>0.4. Alternatively, the two thermoelectrodes 310a and 310b can be made from undoped $ZrTe_5$ and Ti-doped $ZrTe_5$, respectively. In yet another example, the two thermoelectrodes 310a and 310b can include $Pb_{1-x}Sn_xTe$ (e.g., having different compositions).

The In operation, a voltage source can be employed to apply an electric field on the two thermoelectrodes 310a and 310b so as to heat or cool objects attached to the thermocouple 300 (e.g., attached to the electrode 320). In another example, the electrode 320 can be coupled to a heat source (e.g., waste heat from vehicle engines) so as to generate electricity in the circuit including the resistor 340.

Methods of Thermopower Generation

Figure 4:
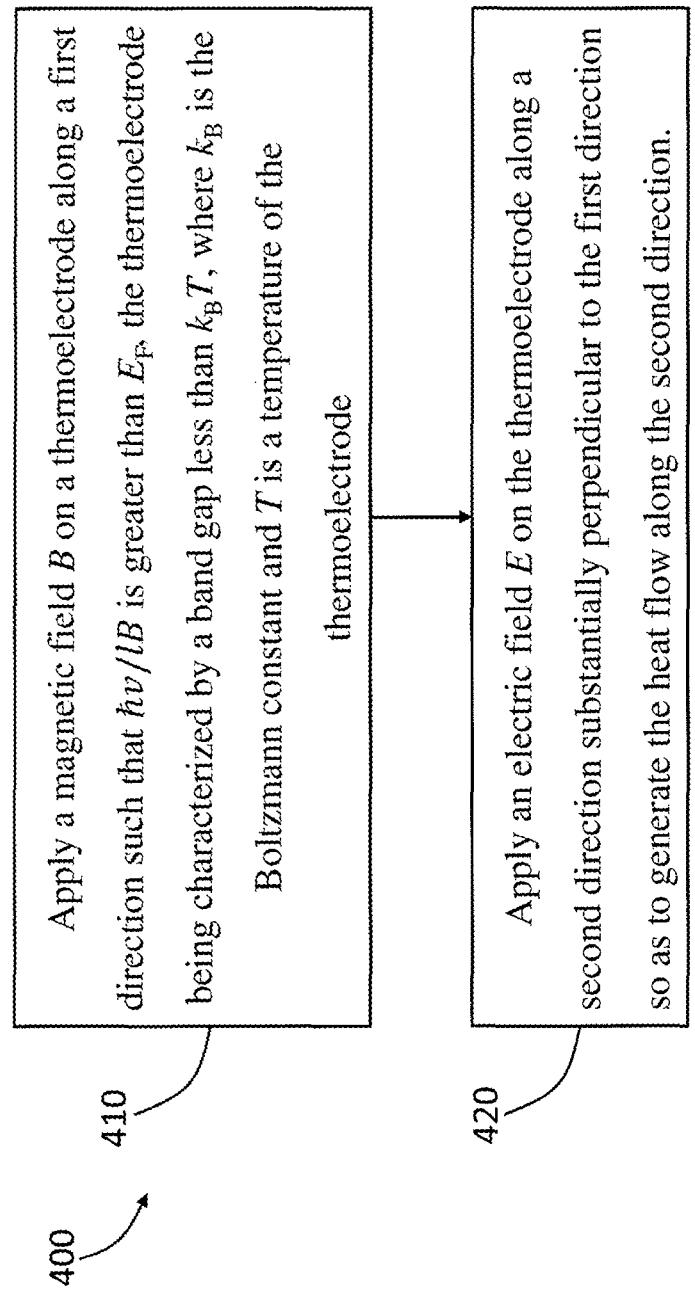
FIG. 4 illustrates a method of thermopower generation.

FIG. 4 illustrates a method 400 of thermopower generation. The method 400 includes, at 410, applying a magnetic field B on a thermoelectrode along a first direction such that $\hbar v/l_B$ is greater than $E_F$, where $\hbar$ is the Planck constant, $v$ is a Dirac velocity of charge carriers in the thermoelectrode, $E_F$ is the Fermi energy of the thermoelectrode, $l_B=\sqrt{\hbar/eB}$, and e is unit electron charge. The thermoelectrode can be substantially similar to the thermoelectrode 110 shown in FIG. 1 and described above. For example, the thermoelectrode can be characterized by a band gap less than $k_B T$, where $k_B$ is the Boltzmann constant and T is a temperature of the thermoelectrode. The method 400 also includes, at 420, applying an electric field E on the thermoelectrode along a second direction substantially perpendicular to the first direction so as to generate the heat flow along the second direction.

In some examples, the applied magnetic field can be configured such that $\omega_c \tau$ is substantially equal to or greater than 1, where $\omega_c=eB/m$, m is the effective mass of charge carriers in the thermoelectrode, and $\tau$ is a momentum scattering time of the charge carriers in the thermoelectrode.

In some examples, the magnetic field B and the electric field E are configured to induce an E×B drift to charge carriers in the thermoelectrode, and the E×B drift dominates a charge transport of the charge carriers.

Analytical Characterizations of Thermopower Generation
Relation Between Seebeck Coefficient and Entropy The Seebeck coefficient is usually associated, conceptually, with the entropy per charge carrier. In a large magnetic field, and in a generic system with some concentrations $n_e$ of electrons and $n_h$ of holes, the precise relation between carrier entropy and thermopower can be derived using the following analysis.

In this analysis, the magnetic field B is oriented in the z direction, and an electric field E is directed along the x direction (see, e.g., FIG. 1). Suppose also that the magnetic field is strong enough that $\omega_c \tau \gg 1$, where $\omega_c$ is the cyclotron frequency and $\tau$ is the momentum scattering time, so that carriers complete many cyclotron orbits without scattering. In this situation charge carriers acquire an E×B drift velocity in the x direction, with magnitude $v_d=E/B$. The direction of drift is identical for both negatively charged electrons and positively charged holes, so that drifting electrons and holes contribute additively to the heat current but oppositely to the electrical current.

The Seebeck coefficient $S_{xx}$ in the x direction can be understood by exploiting the Onsager symmetry relation between the coefficients $\alpha_{ij}$ of the thermoelectric tensor and the coefficients $\Pi_{ij}$ of the Peltier heat tensor: $S_{ij}(B)=\Pi_{ji}(-B)/T$. The Peltier heat is defined by $J^Q_i=\Pi_{ij}J^e_j$, where $J^Q$ is the heat current density at a fixed temperature and $J^e$ is the electrical current density. In the setup considered in this analysis, the electrical current in the x direction is given simply by $J^e_x=ev_d(n_h-n_e)$.

In sufficiently large magnetic fields, the flow of carriers in the x direction can be essentially dissipationless. In this case the heat current in the x direction is related to the entropy current $J^s_x$ by the law governing reversible processes: $J^Q_x=TJ^s_x$. This relation is valid in general when the Hall conductivity $\sigma_{xy}$ is much larger in magnitude than the longitudinal conductivity $\sigma_{xx}$. For a system with only a single sign of carriers this condition can be met when $\omega_c \tau \gg 1$. Define $\hat{s}_e$ and $\hat{s}_h$ as the entropy per electron and per hole, respectively, then $J^s_x=v_d(n_e\hat{s}_e+n_h\hat{s}_h)$, since electrons and holes both drift in the x direction. Combining these relations together arrives at a Seebeck coefficient $S_{xx}=\Pi_{xx}/T=(J^Q_x)/(TJ^e_x)$ that is given by:

$$S_{xx} = \frac{n_h \hat{s}_h + n_e \hat{s}_e}{e(n_h - n_e)} \equiv \frac{\hat{S}}{en} \quad (2)$$

In other words, the Seebeck coefficient in the x direction is given by the total entropy density $\hat{S}$ divided by the net carrier charge density en. Equation (2) can have dramatic implications for the thermopower in gapless three-dimensional (3D) semimetals, where both electrons and holes can proliferate at small $E_F \ll k_B T$.

The remainder of this analysis focuses primarily on the thermopower $S_{xx}$ in the directions transverse to the magnetic field, which can be described according to Equation (2). A brief discussion on the thermopower along the direction of the magnetic field is provided at the end of the analysis. In addition, the contribution to the thermopower arising from phonon drag is neglected in the analysis. This treatment is valid provided that the temperature and Fermi energy $E_F$ are low enough such that $(k_B T/E_F) \gg (T/\Theta D)^3$, where $\Theta D$ is the Debye temperature.

When the response coefficients governing the flow of electric and thermal currents have finite transverse components, as introduced by the magnetic field, the definition of the figure of merit ZT can be generalized from the standard expression of Equation (1). This generalized definition can be arrived at by considering the thermodynamic efficiency of a thermoelectric generator with generic thermoelectric, thermal conductivity, and resistivity tensors. The resulting generalized figure of merit is given by:

$$Z_B T = \frac{S_{xx}^2 T}{\kappa_{xx} \rho_{xx}} \frac{\left(1 - \frac{S_{xy}\kappa_{xy}}{S_{xx}\kappa_{xx}}\right)^2}{\left(1 + \frac{\kappa_{xy}^2}{\kappa_{xx}^2}\right)\left(1 - \frac{S_{xy}^2 T}{\kappa_{xx}\rho_{xx}}\right)} \quad (3)$$

where $\rho_{xx}$ is the longitudinal resistivity.

Similarly, the thermoelectric power factor, which determines the maximal electrical power that can be extracted for a given temperature difference, is given by:

$$PF = \frac{S_{xx}^2}{\rho_{xx}} \frac{\left(1 - \frac{S_{xy}\kappa_{xy}}{\alpha_{xx}\kappa_{xx}}\right)^2}{\left(1 - \frac{S_{xy}^2 T}{\kappa_{xx}\rho_{xx}}\right)} \quad (4)$$

In the limit of $\omega_c \tau \gg 1$, $S_{xy} \ll S_{xx}$, and therefore the remainder of this analysis focuses on the case where $S_{xy}=0$.

In situations where phonons do not contribute significantly to the thermal conductivity, Equation (3) can be simplified by exploiting the Wiedemann-Franz relation, $\kappa = c_0 (k_B/e)^2 T\sigma$, where $c_0$ is a numeric coefficient of order unity $\kappa$ and $\sigma$ and a represent the full thermal conductivity and electrical conductivity tensors. This relation remains valid even in the limit of large magnetic field, so long as electrons and holes are good quasiparticles. In the limit of strongly degenerate statistics, where either $E_F \gg k_B T$ or the band structure has no gap, $c_0$ is given by the usual value $c_0 = \pi^2/3$ corresponding to the Lorentz ratio. In the limit of classical, nondegenerate statistics, where $E_F \ll k_B T$ and the Fermi level resides inside a band gap, $c_0$ takes the value corresponding to classical thermal conductivity: $c_0 = 4/\pi$.

Inserting the Wiedemann-Franz relation into Eq. (3) and setting $S_{xy}=0$ gives:

$$Z_B T = \frac{s_{xx}^2}{c_0 (k_B/e)^2} \quad (5)$$

In other words, when the phonon conductivity is negligible the thermoelectric figure of merit is given to within a multiplicative constant by the square of the Seebeck coefficient, normalized by its natural unit $k_B/e$. As shown below, in a nodal semimetal $S_{xx}/(k_B/e)$ can be parametrically large under the influence of a strong magnetic field, and thus the figure of merit $Z_B T$ can far exceed the typical bound for heavily-doped semiconductors.

In situations where phonons provide a dominant contribution to the thermal conductivity, so that the Wiedemann-Franz law is strongly violated, one generically has $\kappa_{xx} \gg \kappa_{xy}$, and Equation (3) becomes:

$$Z_B T = \frac{s_{xx}^2 T}{\kappa_{xx} \rho_{xx}} \quad (6)$$

Heavily-Doped Semiconductors

This section presents a calculation of the thermopower $S_{xx}$ for a heavily-doped semiconductor, assuming for simplicity an isotropic band mass m and a fixed carrier concentration n. In other words, the doping is sufficiently high doping carriers are not localized onto donor/acceptor impurities by magnetic freezeout.

Figure 5:
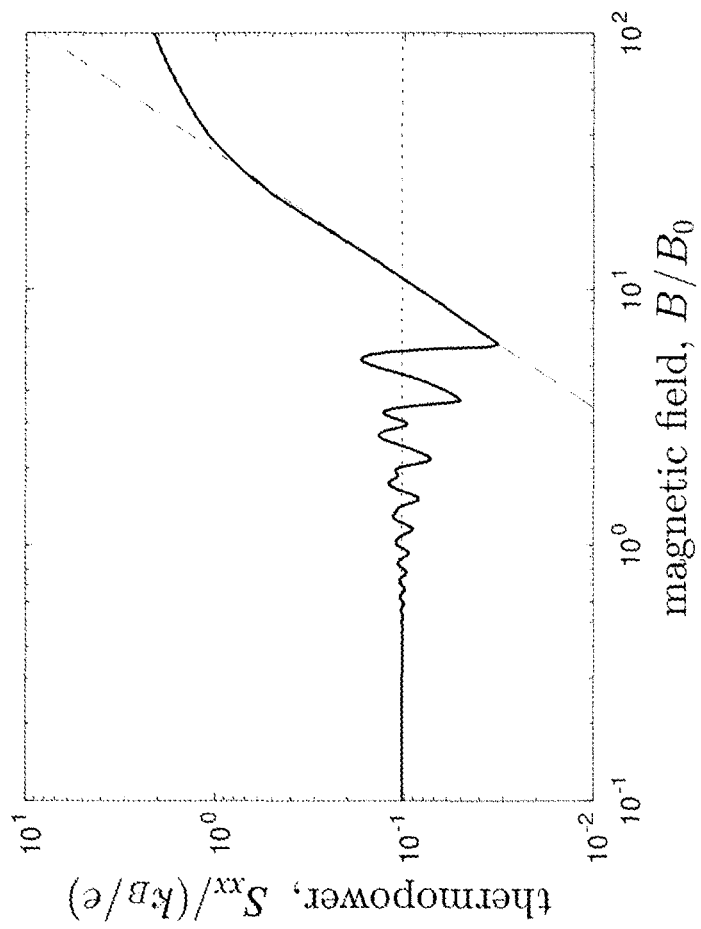
FIG. 5 shows calculated thermopower in the transverse direction as a function of magnetic field for a degenerate semiconductor with parabolic dispersion relation.

FIG. 5 shows calculated thermopower in the transverse direction, $S_{xx}$, as a function of magnetic field for a degenerate semiconductor with parabolic dispersion relation. The magnetic field is plotted in units of $B_0 = \hbar\, n^{2/3}/e$. The temperature is taken to be $T = 0.02 E^{(0)}_F/k_B$, and for simplicity $N_v = 1$ and $g=2$. The dotted line shows the limiting result of Equation (8) below for small B, and the dashed line shows the result of Equation (11) below for the extreme quantum limit. At very large magnetic field the thermopower saturates at about $k_B/e$, with only a logarithmic dependence on B and T, as suggested by Equation (12) below.

This analysis shown in FIG. 2 considers a temperature $T \ll E^{(0)}_F/k_B$, where $E^{(0)}_F$ is the Fermi energy at zero magnetic field. The asymptotic behaviors evidenced in this figure can be understood as follows. In the limit of vanishing temperature, the chemical potential $\mu$ is equal to the Fermi energy $E_F$, and the entropy per unit volume:

$$\hat{S} \cong \frac{\pi^2}{3} k_B^2 T \nu(\mu) \quad (7)$$

where $\nu(\mu)$ is the density of states at the Fermi level. At weak enough magnetic field that $\hbar \omega_c \ll E_F$, the density of states is similar to that the usual 3D electron gas, and the corresponding thermopower is:

$$S_{xx} \cong \frac{k_B}{e} \left(\frac{\pi}{3} N_v\right)^{2/3} \frac{k_B T m}{\hbar^2 n^{2/3}} \quad (8)$$

where $N_v$ is the degeneracy per spin state (the valley degeneracy) and h is the reduced Planck constant.

As the magnetic field is increased, the density of states undergoes quantum oscillations that are periodic in 1/B, which are associated with individual Landau levels passing through the Fermi level. These oscillations are reflected in the thermopower, as shown in FIG. 5.

Equation (8) assumes that impurity scattering is sufficiently weak that $\omega_c\tau\gg1$. For the case of a doped and uncompensated semiconductor where the scattering rate is dominated by elastic collisions with donor/acceptor impurities, this limit corresponds to $l_B\ll\alpha^*_B$, where $l_B=\sqrt{\hbar/eB}$ is the magnetic length and $\alpha^*_B=4\pi\varepsilon\hbar^2/(me^2)$ is the effective Bohr radius, with $\varepsilon$ is the permittivity. In the opposite limit of small $\omega_c\tau$, the thermopower at $k_BT\ll E_F$ is given by the Mott formula:

$$S = \frac{k_B}{e}\frac{\pi^2}{3}\frac{1}{\sigma}\left(\frac{d\sigma(E)}{dE}\right)\bigg|_{E=\mu}, \text{ at } B = 0 \tag{9}$$

where $\sigma(E)$ is the low-temperature conductivity of a system with Fermi energy E. In a doped semiconductor with charged impurity scattering, the conductivity $\sigma\sim E_F^3$, and Eq. (9) gives a value that is twice larger than that of Equation (8).

When the magnetic field is made so large that $\hbar\omega_c\gg E_F$, electrons occupy only the lowest Landau level and the system enters the extreme quantum limit. At such high magnetic fields the density of states rises strongly with increased B, as more and more flux quanta are threaded through the system and more electron states are made available at low energy. As a consequence, the Fermi energy falls relative to the energy of the lowest Landau level, and $E_F$ and $\nu(\mu)$ are given by $$E_F(B) - \frac{\hbar\omega_c}{2} = \frac{2\pi^4\hbar^2 n^2 l_B^4}{mN_s^2 N_v^2} \sim 1/B^2 \tag{10}$$

$$\nu(\mu) = \frac{mN_s^2 N_v^2}{4\pi^4\hbar^2 n l_B^4} \sim B^2$$

Here $N_s$ denotes the spin degeneracy at high magnetic field; $N_s=1$ if the lowest Landau level is spin split by the magnetic field and $N_s=2$ otherwise. So long as the thermal energy $k_BT$ remains smaller than $E_F$, Equation (7) gives a thermopower:

$$S_{xx} \cong \frac{k_B}{e}\frac{N_s^2 N_v^2}{12\pi^2}\frac{me^2 B^2 k_B T}{\hbar^4 n} \tag{11}$$

If the magnetic field is so large that $k_BT$ becomes much larger than the zero-temperature Fermi energy, then the distribution of electron momenta p in the field direction is well described by a classical Boltzmann distribution: $f\sim\text{const.}\times\exp[-p^2/(2mk_BT)]$. Using this distribution to calculate the entropy gives a thermopower:

$$S_{xx} \cong \frac{1}{2}\frac{k_B}{e}\ln\left(\frac{mk_B T N_s^2 N_v^2}{\hbar^2 n^2 l_B^4}\right) \tag{12}$$

In other words, in the limit of such large magnetic field that $\hbar\omega_c\gg k_BT\gg E_F$, the thermopower saturates at a value $\sim k_B/e$ with only a logarithmic dependence on the magnetic field. The argument of the logarithm in Equation (12) is proportional to $k_BT/E_F(B)$. This result is reminiscent of the thermopower in non-degenerate (lightly-doped) semiconductors at high temperature, where the thermopower becomes $\sim(k_B/e)\ln(T)$.

Dirac and Weyl Semimetals

This section presents analysis of the case where quasiparticles have a linear dispersion relation and no band gap (or, more generally, a band gap that is smaller than $k_BT$), as in 3D Dirac or Weyl semimetals. For simplicity, this analysis assumes that the Dirac velocity v is isotropic in space, so that in the absence of magnetic field the quasiparticle energy is given simply by $\varepsilon=\pm vp$ where p is the magnitude of the quasiparticle momentum. The carrier density n is constant as a function of magnetic field, since the gapless band structure precludes the possibility of magnetic freezeout of carriers.

Figure 6:
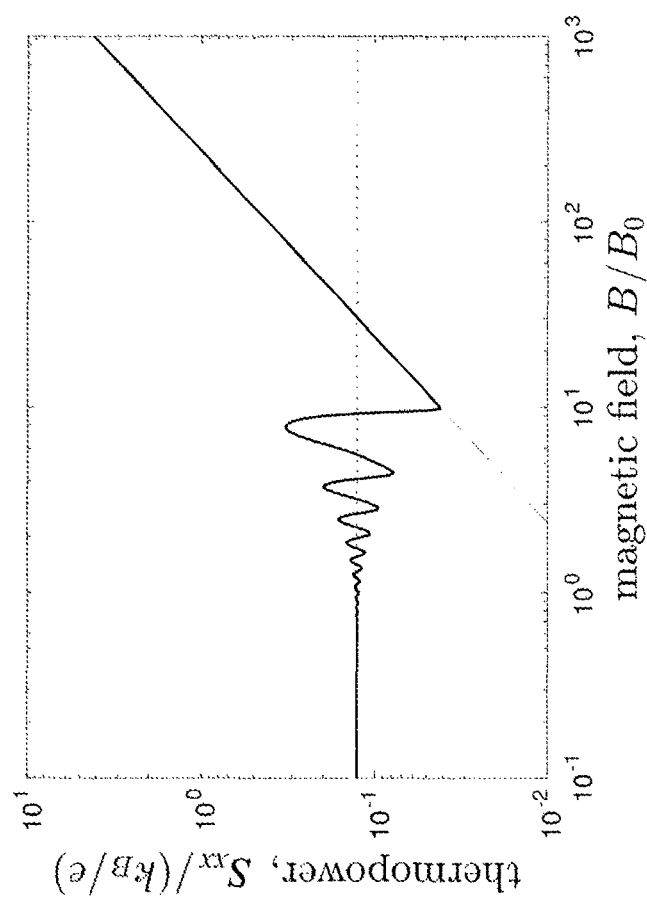
FIG. 6 shows calculated thermopower in the transverse direction as a function of magnetic field for a gapless semimetal with linear dispersion relation.

FIG. 6 shows calculated thermopower in the transverse direction as a function of magnetic field for a gapless semimetal with linear dispersion relation. Units of magnetic field are $B_0=\hbar n^{2/3}/e$. In this example the temperature is taken to be $T=0.01E_F^{(0)}/k_B$ and $N_v=1$. The dotted line is the low field limit given by Equation (13) below and the dashed line is the extreme quantum limit result of Equation (15). Unlike the semiconductor case, at large magnetic field the thermopower continues to grow with increasing B without saturation.

The limiting cases for the thermopower shown in FIG. 6 can be understood as follows. In the weak field regime $\hbar\omega_c\ll E_F$, the electronic density of states is relatively unmodified by the magnetic field, and one can use Equation (7) with the zero-field density of states $\nu(\mu)=(9N_v/\pi^2)^{1/3}n^{2/3}/\hbar v$. This procedure gives a thermopower:

$$S_{xx} \cong \frac{k_B}{e}\left(\frac{\pi^4}{3}\right)^{1/3}\frac{k_B T}{\hbar v}\left(\frac{N_v}{n}\right)^{1/3} \tag{13}$$

Here $N_v$ is understood as the number of Dirac nodes; for a Weyl semimetal, $N_v$ is equal to half the number of Weyl nodes. Equation (13) applies when $\omega_c\tau\gg1$. If the dominant source of scattering comes from uncompensated donor/acceptor impurities, then the condition $\omega_c\tau\gg1$ corresponds to $B\gg en^{2/3}/(4\pi\varepsilon v)$. In the opposite limit of small $\omega_c\tau$, the thermopower can be evaluated using the Mott relation (e.g., Equation (9)). A Dirac material with Coulomb impurity scattering has $\sigma(E)\sim E^4$, so in the limit $\omega_c\tau\ll1$ the thermopower is larger than Equation (13) by a factor 4/3.

As the magnetic field is increased, the thermopower undergoes quantum oscillations as higher Landau levels are depopulated. At a large enough field that $$\frac{\hbar v}{l_B} > E_F,$$

the system enters the extreme quantum limit and the Fermi energy and density of states become strongly magnetic field dependent. In particular, $$\mu \approx \frac{2\pi^2}{N_v}\hbar v n l_B^2 \propto 1/B \tag{14}$$

-continued $$\nu(\mu) \approx \frac{N_\nu}{2\pi^2 \hbar \nu l_B^2} \propto B$$

The rising density of states implies that the thermopower also rises linearly with magnetic field. From Equation (7):

$$S_{xx} \cong \frac{k_B}{e}\left(\frac{N_\nu}{6}\right)\frac{k_B T e B}{\hbar^2 \nu n} \quad (15)$$

Remarkably, this relation does not saturate when $\mu$ becomes smaller than $k_B T$. Instead, Equation (15) continues to apply up to arbitrarily high values of B, as $\mu$ declines and the density of states continues to rise with increasing magnetic field. This lack of saturation may be attributed to the gapless band structure, which guarantees that there is no regime of temperature for which carriers can described by classical Boltzmann statistics, unlike in the semiconductor case when the chemical potential falls below the band edge.

In more physical terms, the non-saturating thermopower can be associated with a proliferation of electrons and holes at large $(k_B T)/\mu$. Unlike in the case of a semiconductor with large band gap, for the Dirac/Weyl semimetal the number of electronic carriers is not fixed as a function of magnetic field. As $\mu$ falls and the density of states rises with increasing magnetic field, the concentrations of electrons and holes both increase even as their difference $n = n_e - n_h$ remains fixed.

Since in a strong magnetic field both electrons and holes contribute additively to the thermopower (as depicted in FIGS. 1 and 2), the thermopower $S_{xx}$ increases without bound as the magnetic field is increased. This is notably different from the usual situation of semimetals at B=0, where electrons and holes contribute oppositely to the thermopower.

The unbounded growth of $S_{xx}$ with magnetic field also allows the figure of merit $Z_B T$ to grow, in principle, to arbitrarily large values. For example, in situations where the Wiedemann-Franz law holds, Equation (5) implies a figure of merit that grows without bound in the extreme quantum limit as $B^2 T^3$. On the other hand, if the phonon thermal conductivity is large enough that the Wiedemann-Franz law is violated, then the behavior of the figure of merit depends on the field and temperature dependence of the resistivity. As discussed below, in the common case of a mobility that declines inversely with temperature, the figure of merit grows as $B^2 T^2$, and can easily become significantly larger than unit in experimentally accessible conditions.

Thermopower in the Longitudinal Direction

At low temperature $k_B T \ll E_F$ the thermopower $S_{zz}$ can be estimated using the usual zero-field expression, Equation (9), where $\sigma$ is understood as $S_{zz}$. This procedure gives the usual thermopower $S_{zz} \sim k_B^2 T/(e E_F)$. Such a result has a weak dependence on magnetic field outside the extreme quantum limit $\hbar \omega_c \ll E_F$, and rises with magnetic field when the extreme quantum limit is reached in the same way that $S_{xx}$ does. That is, $S_{zz} \sim B^2$ for the semiconductor case [as in Equation (11)] and $S_{zz} \sim B$ for the Dirac semimetal case [as in Equation (15)], provided that $E_F \gg k_B T$.

However, when the magnetic field is made so strong that $E_F(B) \ll k_B T$, the thermopower $S_{zz}$ saturates. This can be seen by considering the definition of thermopower in terms of the coefficients of the Onsager matrix: $\alpha = L^{12}/L^{11}$, where $L^{11} = -\int dE f'(E)\sigma(E)$ and $L^{12} = -1/(eT)\int dE f'(E)(E-\mu)\sigma(E)$. In the limit where $k_B T \gg |\mu|$, the coefficient $L^{11}$ is equal to $\sigma$ while $L^{12}$ is of order $k_B \sigma/e$. Thus, unlike the behavior of $S_{xx}$, the growth of the thermopower in the field direction saturates when $S_{zz}$ becomes as large as about $k_B/e$. This difference arises because in the absence of a strong Lorentz force electrons and holes flow in opposite directions under the influence of an electric field and thereby contribute oppositely to the thermopower. The strong E×B drift causes both electrons and holes to flow in the same direction, thereby allowing the Dirac semimetal to have an unbounded thermopower $S_{xx}$ in the perpendicular direction.

Experimental Realizations of Unsaturated Thermopower Generation

A thermopower of order $k_B/e$ can be achieved in semiconductors, particularly when the donor/acceptor states are shallow and the doping is light. However, it can be more beneficial to achieve the $B^2$ enhancement of $S_{xx}$ shown in Equation (11) for heavily-doped semiconductors. In this case, it can be helpful for the semiconductor to remain a good conductor at low electron concentration and low temperature, so that the extreme quantum limit is achievable at not-too-high magnetic fields. This condition is possible for semiconductors with relatively large effective Bohr radius $\alpha^*_B$ either because of a small electron mass or a large dielectric constant. For example, the extreme quantum limit can be reached in 3D crystals of HgCdTe, InAs, and SrTiO₃. SrTiO3, in particular, represents a good platform for observing large field enhancement of the thermopower, since its enormous dielectric constant allows one to achieve metallic conduction with extremely low Fermi energy. For example, using the conditions where $n \sim 5 \times 10^{16}$ cm$^{-3}$ and T=20 mK, the value of $S_{xx}$ can be expected to increase about 50 times between B=5 T and B=35 T. The corresponding increase in the figure of merit is similarly large, although at such low temperatures the magnitude of $Z_B T$ remains relatively small.

For nodal semimetals, $S_{xx}$ does not saturate at about $k_B/e$, but continues to grow linearly with B without saturation. For example, in the Dirac material $Pb_{1-x}Sn_x Se$, the thermopower $S_{xx}$ as a function of magnetic field can have quantum oscillations at low field followed by a continuous linear increase with B upon entering the extreme quantum limit. The linear increase in $S_{xx}$ can continue without bound as B and/or T is increased. This results can be expected to hold even when there is a small band gap, provided that this gap is smaller than either $k_B T$ or $E_F$.

Quantitative estimation of the thermopower and figure of merit for $Pb_{1-x}Sn_x Se$ under generic experimental conditions can be carried out using Equation (15). Inserting the measured value of the Dirac velocity gives:

$$S_{xx} = \left(0.4\frac{\mu V}{K}\right) \times \frac{(T[k])(B[T])}{n[10^{17} cm^{-3}]} \quad (16)$$

For example, a $Pb_{1-x}Sn_x Se$ crystal with a doping concentration $n=10^{17}$ cm$^{-3}$ at temperature T=300K and subjected to a magnetic field B=30 T can produce a thermopower $S_{xx}$ around 3600 µV/K. At such low doping, the Wiedemann-Franz law is strongly violated due to a phonon contribution to the thermal conductivity that is much larger than the electron contribution, and $\kappa_{xx}$ is of order 3 W/(m K). The value of $\rho_{xx}$ can be estimated from measurements. The mobility $\mu_e$ can reach about $10^5$ cm$^2$V$^{-1}$s$^{-1}$ at zero temperature and decline as $\mu_e$ approaches $(1.5 \times 10^6$ cm$^2$V$^{-1}$s$^{-1})/(T$ [K]) at temperatures above about 20 K.

Inserting these measurements into Equation (6), and using $\rho_{xx}=1/(ne\mu_e)$, gives a figure of merit:

$$Z_B T \sim 1.3 \times 10^{-7} \times \frac{(T[k])^2 (B[T])^2}{n[10^{17} \text{cm}^{-3}]} \quad (17)$$

For example, at $n=10^{17}$ cm$^{-3}$, T=300 K, and B=30 T, the figure of merit can apparently reach an unprecedented value $Z_B T$ of about 10. Such experimental conditions are already achievable in the laboratory, so that the above results suggest an immediate pathway for arriving at record-large figure of merit.

The doping concentration can be reduced to $n=3\times 10^{15}$ cm$^{-3}$ (as can be achieved, for example, in the Dirac semi-metals ZrTe$_5$ and HfTe$_5$). In this case, the room-temperature figure of merit can be larger than unity already with B greater than 1 T. The corresponding power factor is also enormously enhanced by the magnetic field:

$$PF \approx \left(4 \times 10^{-3} \frac{\mu W}{\text{cm} K^2}\right) \times \frac{(T[k])(B[T])^2}{n[10^{17} \text{cm}^{-3}]} \quad (18)$$

The PF can be about 1000 μW/(cmK$^2$) at $n=10^{17}$ cm$^{-3}$, T=300 K, and B=30 T. Equation. (15) also implies a thermopower that is largest in materials with low Dirac velocity and high valley degeneracy. In this sense there appears to be considerable overlap between the search for effective thermoelectrics and the search for novel correlated electronic states.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A thermoelectric device, comprising:
   a thermoelectrode characterized by a band gap less than $k_B T$, where $k_B$ is the Boltzmann constant and T is a temperature of the thermoelectrode;
   a magnetic field source, operably coupled to the thermoelectrode, to apply a magnetic field B on the thermoelectrode along a first direction; and
   a voltage source, operably coupled to the thermoelectrode, to apply an electric field E on the thermoelectrode along a second direction substantially perpendicular to the first direction so as to generate a heat flow along the second direction.

2. The thermoelectric device of claim 1, wherein the thermoelectrode comprises a semimetal.

3. The thermoelectric device of claim 1, wherein the thermoelectrode comprises a Weyl semimetal.

4. The thermoelectric device of claim 1, wherein the thermoelectrode comprises a three-dimensional (3D) Dirac metal.

5. The thermoelectric device of claim 1, wherein the thermoelectrode comprises a doped semiconductor having a doping concentration of about $10^{15}$ cm$^{-3}$ to about $10^{19}$ cm$^{-3}$.

6. The thermoelectric device of claim 1, wherein the magnetic field source is configured to generate the magnetic field B such that $\hbar v/l_B$ is greater than $E_F$, where $\hbar$ is the Planck constant, v is a Dirac velocity of charge carriers in the thermoelectrode, $E_F$ is the Fermi energy of the thermoelectrode, $l_B = \sqrt{\hbar/eB}$, and e is unit electron charge.

7. The thermoelectric device of claim 1, wherein the magnetic field source is configured to generate the magnetic field substantially equal to or greater than 1 T.

8. The thermoelectric device of claim 1, wherein the thermoelectrode has a first resistivity longitudinal to the first direction and a second resistivity transverse to the first direction, and the second resistivity is at least 5 times greater than the first resistivity.

9. The thermoelectric device of claim 1, wherein charge carriers in the thermoelectrode are characterized by a linear dispersion.

10. A thermoelectric device, comprising:
    a thermoelectrode characterized by a band gap less than $k_B T$, where $k_B$ is the Boltzmann constant and T is a temperature of the thermoelectrode;
    a magnetic field source, operably coupled to the thermoelectrode, to apply a magnetic field B on the thermoelectrode along a first direction; and
    a heat source, operably coupled to the thermoelectrode, to apply a heat flow on the thermoelectrode along a second direction substantially perpendicular to the first direction so as to generate an electric field along the second direction of the heat flow.

11. The thermoelectric device of claim 10, wherein the thermoelectrode comprises a semimetal.

12. The thermoelectric device of claim 10, wherein the thermoelectrode comprises a Weyl semimetal.

13. The thermoelectric device of claim 10, wherein the thermoelectrode comprises a three-dimensional (3D) Dirac metal.

14. The thermoelectric device of claim 10, wherein the thermoelectrode comprises a doped semiconductor.

15. The thermoelectric device of claim 10, wherein the magnetic field source is configured to generate the magnetic field B such that $\hbar v/l_B$ is greater than $E_F$, where $\hbar$ is the Planck constant, v is a Dirac velocity of charge carriers in the thermoelectrode, $E_F$ is the Fermi energy of the thermoelectrode, $l_B = \sqrt{\hbar/eB}$, and e is unit electron charge.

16. The thermoelectric device of claim 10, wherein the magnetic field source is configured to generate the magnetic field substantially equal to or greater than 1 T.

17. The thermoelectric device of claim 10, wherein $\omega_c \tau$ is substantially equal to or greater than 1, where $\omega_c = |q|B/m$, wherein q is an electric charge of charge carriers in the thermoelectrode, m is the mass of charge carriers in the thermoelectrode, and $\tau$ is a momentum scattering time of the charge carriers in the thermoelectrode.

18. The thermoelectric device of claim 10, wherein charge carriers in the thermoelectrode are characterized by a linear dispersion.

* * * * *